(12) United States Patent
Lin et al.

(10) Patent No.: US 10,317,070 B2
(45) Date of Patent: Jun. 11, 2019

(54) INTEGRATED COMBUSTION DEVICE POWER SAVING SYSTEM

(71) Applicant: INDUSTRIAL TECHNOLOGY RESEARCH INSTITUTE, Hsin-Chu (TW)

(72) Inventors: Yu-Li Lin, Chiayi (TW); Chien-Hsuan Yeh, Miaoli County (TW); Bo-Yi Sung, Zhubei (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 95 days.

(21) Appl. No.: 15/295,087

(22) Filed: Oct. 17, 2016

(65) Prior Publication Data
US 2017/0159930 A1   Jun. 8, 2017

(30) Foreign Application Priority Data

Dec. 8, 2015   (TW) .............................. 104141175 A

(51) Int. Cl.
*F22B 1/18* (2006.01)
*H01L 35/30* (2006.01)
(Continued)

(52) U.S. Cl.
CPC .............. *F22B 1/1838* (2013.01); *F01K 7/16* (2013.01); *F01K 23/067* (2013.01); *F01K 25/08* (2013.01);
(Continued)

(58) Field of Classification Search
CPC ...... F22B 1/1838; H01L 35/30; F01K 23/067; F01K 7/16; F01K 25/08; F23K 5/002
See application file for complete search history.

(56) References Cited

U.S. PATENT DOCUMENTS 9,017,436 B2   4/2015  Chen et al.
2004/0079087 A1*  4/2004  Chandran .............. C10J 3/482
                                                                60/781
(Continued)

FOREIGN PATENT DOCUMENTS

CN        1070037 A     3/1993
CN      101435367 A     5/2009
(Continued)

OTHER PUBLICATIONS

Ignace Vankeirsbilck et al., "Energetical", Sep. 2011 http://orc2011.fyper.com/uploads/File/presentations1/Energetical,%20Technical%20and%20Economical%20consideration%20by%20choosing%20between%20a%20steam%20and%20ORC%20for%20small%20%20scale%20power%20generation.pdf.*

(Continued)

*Primary Examiner* — Steven S Anderson, II
(74) *Attorney, Agent, or Firm* — Locke Lord LLP; Tim Tingkang Xia, Esq.

(57) ABSTRACT

An integrated combustion device power saving system includes: a hydrogen generation device, for generating a hydrogen-rich gas; a combustion device, for receiving the hydrogen-rich gas for combustion and generating heat energy and flue gas; a smoke distributing device, for distributing flue gas to the hydrogen generation device or atmosphere; a hydrogen-generation feed preheating device, for capturing waste heat of the flue gas from the smoke distributing device to preheat a hydrogen-generation feed to be used in the hydrogen generation device; and a power generating device, for receiving the flue gas from the hydrogen-generation feed preheating device while recycling waste heat of the flue gas to generate power to at least one of the hydrogen generation device or the combustion device.

9 Claims, 7 Drawing Sheets

(51) Int. Cl.
*F01K 25/08* (2006.01)
*F01K 7/16* (2006.01)
*F01K 23/06* (2006.01)
*F23K 5/00* (2006.01)

(52) U.S. Cl.
CPC .............. *F23K 5/002* (2013.01); *H01L 35/30* (2013.01); *Y02E 20/18* (2013.01)

(56) References Cited

U.S. PATENT DOCUMENTS

| | | | |
|---|---|---|---|
| 2006/0179816 | A1 | 8/2006 | Murphy et al. |
| 2007/0215520 | A1 | 9/2007 | Edwin et al. |
| 2009/0178336 | A1* | 7/2009 | Van Der Ploeg ........ B01J 8/003 48/77 |
| 2009/0217584 | A1* | 9/2009 | Raman ....................... C10J 3/00 48/127.7 |
| 2010/0178624 | A1* | 7/2010 | Srinivasachar ......... F23K 5/002 431/253 |
| 2011/0067410 | A1 | 3/2011 | Zubrin et al. |
| 2012/0040295 | A1 | 2/2012 | Lylykangas |
| 2012/0186252 | A1* | 7/2012 | Schmidt .................... F22B 1/18 60/649 |
| 2012/0260962 | A1 | 10/2012 | Caroff et al. |
| 2012/0312015 | A1 | 12/2012 | Ng |
| 2013/0067815 | A1* | 3/2013 | Koseoglu .................. C01B 3/36 48/211 |
| 2014/0072888 | A1* | 3/2014 | Harada ............... H01M 8/0612 429/410 |
| 2015/0027053 | A1* | 1/2015 | Lin ........................... C01B 3/38 48/89 |
| 2015/0267567 | A1* | 9/2015 | Clements .................. F01K 7/22 60/671 |

FOREIGN PATENT DOCUMENTS

| | | |
|---|---|---|
| CN | 101604933 A | 12/2009 |
| CN | 201666574 U | 12/2010 |
| CN | 101943026 A | 1/2011 |
| CN | 102061994 A | 5/2011 |
| CN | 102865166 A | 1/2013 |
| CN | 103045308 A | 4/2013 |
| CN | 103183315 A | 7/2013 |
| CN | 103205276 A | 7/2013 |
| CN | 103373705 | * 10/2013 |
| CN | 103827475 A | 5/2014 |
| CN | 103373705 B | 3/2015 |
| JP | 2006-257906 A | 9/2006 |
| JP | 2009-250093 A | 10/2009 |
| JP | 2012-243402 A | 12/2012 |
| TW | I340792 B | 4/2011 |
| TW | 201250184 A | 12/2012 |
| TW | I397631 B | 6/2013 |
| TW | I438957 B | 5/2014 |
| WO | 2012062529 A2 | 5/2012 |

OTHER PUBLICATIONS

EP Extended European Search Report dated May 22, 2017.
Japan Patent Office, "Office Action", dated Sep. 26, 2017, Japan.
Lars Sitzki et al., Combustion in Microscale Heat-Recirculating Burners, The Third Asia-Pacific Conference on Combustion, 2001.
Samuel B. Schaevitz et al., A Combustion Based MEMS Thermoelectric Power Generator, Transducers '01 Eurosensors XV, The 11th International Conference on Solid-State Sensors and Actuators, 2001, 30-33.
J.A. Federici et al., Catalytic microcombustors with integrated thermoelectric elements for portable power production, Journal of Power Sources, 2006, 1469-1478, 161.
T. Ohta et al., Combustion technology of oil mixed with hydrogen produced from water in situ, International Journal of Hydrogen Energy, 1983, 929-930, vol. 8, Issues 11-12.
Gao Min et al., Conversion Efficiency of Thermoelectric combustion systems, IEEE Transactions on Energy Conversion 2007, 528-534, vol. 22, No. 2.
K. Yoshida et al., High-energy density miniature electrical and thermal power source using catalytic combustion, The Fourth International Workshop on Micro and Nanotechnology for Power Generation and Energy Conversion Applications, Power MEMS, 2004, 120-123.
Feng Wang et al., Thermoelectric generation coupling methanol steam reforming chacteristic in microreactor, Energy, 2015, 642-653, 80.
Intellectual Property Office, Ministry of Economic Affairs, R. O. C, "Office Action", dated Aug. 11, 2016, Taiwan.
Intellectual Property Office, Ministry of Economic Affairs, R. O. C, "Office Action", dated Feb. 10, 2017, Taiwan.
European Patent Office, "Office Action", dated Aug. 7, 2018.
Tao Bang Yan, Thermoelectric Enhineering and Environment Protection, 2009, Shanghai Power Equipment Research Institute, Chinese Electric Power Press.
SIPO State Intellectual Property Office, "Office Action", dated Jun. 27, 2018, China.
Japan Patent Office, "Notice of Allowance", dated Aug. 28, 2018.

* cited by examiner

INTEGRATED COMBUSTION DEVICE POWER SAVING SYSTEM

CROSS REFERENCE TO RELATED APPLICATION

This application also claims priority to Taiwan Patent Application No. 104141175 filed in the Taiwan Patent Office on Dec. 8, 2015, the entire content of which is incorporated herein by reference.

TECHNICAL FIELD

The present disclosure relates to an integrated combustion device power saving system, and more particularly, to an integrated combustion device power saving system capable of recycling waste heat generated from its combustion device.

BACKGROUND

Statistically, the industrial sector generally accounts for 38% of the total energy consumption, within which the combustion devices take on about 70% of the energy consumed by the industrial sector. Therefore, the increasing in the combustion efficiency of the combustion devices can be the most beneficial way to save energy consumption.

Generally, there are two types of heating devices being used in industrial manufacturing processes, which are combustion devices and electrical heaters, such as boilers, melting furnaces, furnace, heat treatment furnace, forging furnace, blast furnaces, kilns, and so on. Among those, the most common heating devices that are used are the combustion devices. However, the combustion devices can't operate without the help of electrical peripheral devices, including: blowers, pumps, and control circuits, etc. Thus, for a combustion device to operate smoothly, it is required to be provided with fuel and elecytricity at the same time. Therefore, from the user's point of view, the means for fuel saving and electricity saving should be adopted simultaneously so as to minimizing energy expense in the combustion devices and thus enabling the econimic efficiency to be maximized for the whole industrial manufacturing process using the combustion devices.

In combustion devices, combustion is a high-temperature exothermic redox chemical reaction between a fuel and an oxidant, usually atmospheric oxygen, and often gaseous products, including natural gas, diesel and heavy oil. The heat resulting from the combustion is then used for heating water or a raw material to a designated temperature for melting, boiling, evaporating, or other heat treatment processes. Nevertheless, after reaching the designated temperature, the excess heat from the combustion is generally recycled by the use of a heat recycling device while allowing some to be wasted in a form of hot flue gas or radiation. Overall. The energy utilization rate for a combustion device is depended on the quality of the combustion condition and the heat utilization in the manufacturing process, while the excess heat is usually dissipated or discharged. Thus, the energy loss in an operating combustion device can be the result of imcomplete combustion, waste heat discharging, or heat dissipated from the low-temperature insulation walls and piping in the combustion system. Among which, the imcomplete combustion not only can cause fuel value loss in a manufacturing process, but also it can cause more pollutants to be generated, such as CO, $SO_x$, $NO_x$, and powders emission, and thus more related issues can be caused, including air pollution and dirty contaminated equipment. On the other hand, the dissipation of excess heat is more than just waste in thermal energy, it can also cause a sort of heat pollution in the general working area of the combustion device, while eventually causing higher electric bill to be spent for air conditioning.

Hydrogen that is used as fuel had already been proven to be advantageous in fuel consumption reduction and reducing pollutant reduction in exhaust. Taking the generator that uses methane as fuel for example, its $CO_2$ emission can be effectively reduced after dosing a small amount of hydrogen, ex. 10% vol, into methane at a specific condition that will enables the combustion efficiency to be significantly increased by about 20%, and thus the fuel consumption can be reduced significantly. As fuel can account for about 90% in the whole operation cost for a common combustion device, any kind of saving in fuel consumption can be a great help for cost saving. Therefore, exactly how must cost can be saved depends upon the accessibility of hydrogen, i.e. the means for generating and obtaining hydrogen. It is noted that the majority of hydrogen on Earth exists in a form of compound, such as water, and only a few exists in reduced form. Therefore, it is common to access hydrogen using an artificial means, whereas the most common artificial means for producing hydrogen includes: hydrogen production as byproduct in crude oil pyrolysis, hydrogen production as byproduct in a chemical industry and hydrogen production in water electrolysis. Among which, in crude oil pyrolysis, hydrogen is produced mainly in the reforming reaction process, where the mixture of hydrocarbon and water is decomposed at a high temperature into oxycarbide and hydrogen with a certain amount of carbon deposition. As water electrolysis is enabled by electricity and is the decomposition of water into oxygen and hydrogen due to the conduction of an electric current through water, which can be a clean and simple procedure. Comparing to the hydrocarbon reforming process which will inevitably casue some carbon emission, the electrolysis is a process of zero-carbon emission. Nevertheless, if the electricity used for powering the electrolysis is generated by a fossil fuel burning power plant, it is difficult to say that such electrolysis is zero-carbon emission and even that the carbon emission may not be less than the reforming reaction process in crude oil pyrolysis.

In addition to the difference in the use of different energy sources, the difference between the reforming reaction process in in crude oil pyrolysis and the water electrolysis is that: the byproducts of the reforming reaction process in in crude oil pyrolysis is mainly composed of hydrogen and carbon dioxide with a small amount of carbon monoxide, while the products of the water electrolysis are only hydrogen and oxygen. It is noted that combusion is a high-temperature exothermic redox chemical reaction between a fuel and an oxidant that are mixed into a mixture with a specific concentration. Without containing any oxygen, the hydrogen-rich gases that are produced from the reforming reaction process in in crude oil pyrolysis can be transported safely without any combustion hazard before entering into the combustion chamber if the transportation circuit is properly sealed and the flow speed is well controlled. On the other hand, although the hydrogen being produced by water electrolysis can also be safely transported if its transportation circuit is properly sealed and the flow speed is well controlled, such hydrogen transportation is still more hazardous comparing to those in crude oil pyrolysis since there is oxygen existed simultaneously with hydrogen. Moreover, as the reforming reaction process in in crude oil pyrolysis is a high-temperature catalytic reaction, it is enabled by external heating so that the waste heat from the combustion device can be recycled and used for triggering such reforming reaction process. Thus, the cost for hydrogen production can be greatly reduced comparing to the electrical water electrolysis.

Although the effectiveness of hydrogen-assisted combustion had been proven and there are already a variety of hydrogen production processes available, there is little practical cases existed due to safety concerns in hydrogen usage or the lack of information about how to obtain hydrogen. Therefore, there is little industry had actually adopt the hydrogen-assisted combustion means.

The waste heat recycle means is a mature technique used in conventional turbine generators. However, as the operation temperature for recycling waste heat in those turbine generators is generally higher than 300° C., such waste heat recycling technique cannot be adapted for other heat sources that are lower than 300° C. Nevertheless, considering the increasing power demand, low-temperature waste heat recycling technique below 300° C. is becoming more and more ergently needed despite that most industrial waste heat temperatures are lower than 300° C. The low-temperature waste heat recycling technique below 300° C. whose effectiveness had already been proven includes: the Organic Rankine Cycle (ORC) and the related techniques, and the Thermoelectric Power Generation (TEG). The Organic Rankine cycle (ORC) is named for its use of an organic, high molecular mass fluid with a boiling point, occurring at a lower temperature than the water-steam phase change. The working principle of the organic Rankine cycle is the same as that of the conventional generator, but it requires larger working area and is suitable for high-volume power plants that generate more than 100 kW. On the other hand, the TEG is a solid state device that converts heat (temperature differences) directly into electrical energy through a phenomenon called the Seebeck effect (a form of thermoelectric effect). Thermoelectric generators function like heat engines, but are less bulky and have no moving parts, so that it can be adapted for low-volume power plants that generate less than 100 kW. However, TEGs are typically more expensive and less efficient. Nowadays, the ORC and TEG can both be found in various industrial waste heat recycling applications.

Form the above description, the current operation condition of conventional combustion devices can be concluded as following: there is a great amount of waste heat in the exhaust flue gas being discharged from the combustion devices; the incomplete combustion is common in the conventional combustion devices, so that the operation of the conventional combustion devices can cause high pollution; the air-fuel ratio in those conventional combustion devices is limited within a specific range; the peripheral devices for the conventional combustion devices are operating with high power consumption; and there is little and slow progress in the improvement of the conventional combustion devices. Consequently, the conventional combustion devices have the following disadvantages: high energy waste; the heat recycling devices for the conventional combustion devices can be easily damaged; the exhaust flue gas of the conventional combustion devices can cause high environmental pollution; the operation of the conventional combustion devices can easily generate a high volume of $NO_x$, with high heat loss. Therefore, it is in need of an integrated combustion device power saving system capable of recycling waste heat to be used as power source for generating hydrogen in the reforming reaction process of crude oil pyrolysis, while allowing the generated hydrogen to be used for assisting and improving the combustion efficiency of the integrated combustion device; or recycling waste heat and converting heat (temperature differences) directly into electrical energy so as to be provided and feedbacked to the integrated combustion device. Thereby, the fuel consumption is reduced, the waste flue gas quality is improved, the lifespan of the heat recycling device is prolonged, and the integrated combustion device can act as a power generator itself for reducing its dependence upon external power grid.

SUMMARY

In an embodiment, the present disclosure provides an integrated combustion device power saving system, which comprise:

a hydrogen generation device, for generating a hydrogen-rich gas;

a combustion device, coupled to the hydrogen generation device for receiving the hydrogen-rich gas to be used for combustion and generating heat energy and flue gas;

a smoke distributing device, coupled to the hydrogen generation device and the combustion device for distributing flue gas to the hydrogen generation device or atmosphere;

a hydrogen-generation fuel preheating device, coupled to the smoke distributing device for capturing waste heat of the flue gas from the smoke distributing device to preheat a hydrogen-generation feed to be used in the hydrogen generation device; and a power generating device, coupled to the hydrogen-generation fuel preheating device for receiving the flue gas from the hydrogen generation fuel preheating device while recycling waste heat of the flue gas to generate power to at least one of the devices selected from the group consisting of: the hydrogen generation-device and the combustion device.

In another embodiment, the present disclosure provides an integrated combustion device power saving system, which comprise:

a hydrogen generation device, for generating a hydrogen-rich gas;

a combustion device, coupled to the hydrogen generation device for receiving the hydrogen-rich gas to be used for combustion and generating heat energy and flue gas;

a smoke distributing device, coupled to the hydrogen generation device and the combustion device for distributing flue gas to the hydrogen generation device or atmosphere; and a hydrogen-generation fuel preheating device, coupled to the smoke distributing device for capturing waste heat of the flue gas from the smoke distributing device to preheat a hydrogen-generation fuel to be used in the hydrogen generation device.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

Figure 1:
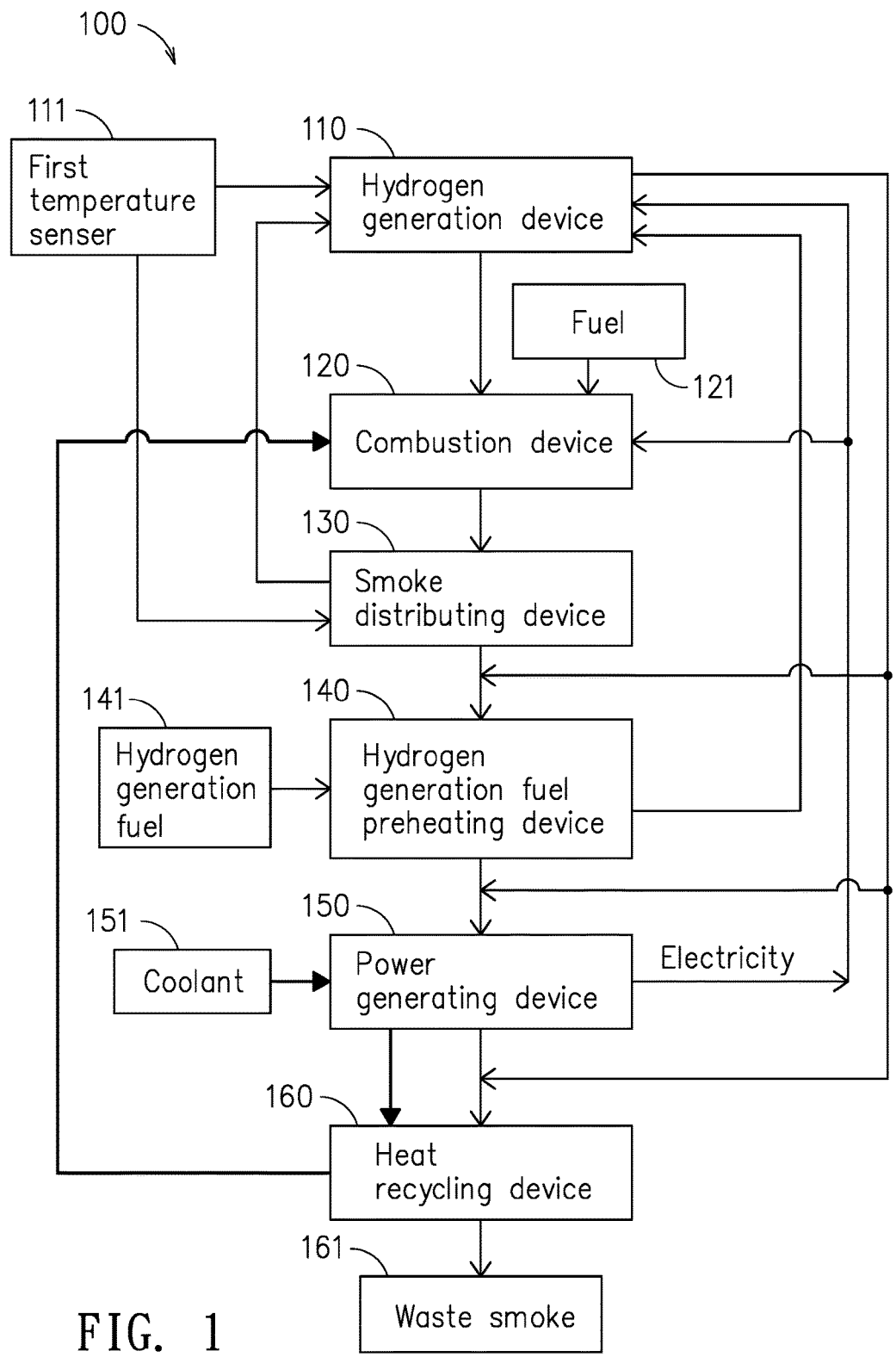
FIG. 1 is a block diagram of an integrated combustion device power saving system according to an embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1, which is a block diagram of an integrated combustion device power saving system according to an embodiment of the present disclosure. As shown in FIG. 1, an integrated combustion device power saving system 100 is disclosed, which comprises: a hydrogen generation device 110, a combustion device 120, a smoke distributing device 130, a hydrogen-generation fuel preheating device 140, a power generating device 150, and a heat recycling device 160.

The hydrogen generation device 110 is used for generating a hydrogen-rich gas, which containing $H_2$, $CO_2$, $CO$ and other byproducts, and the hydrogen generation device 110 can be a steam reformer or a plasma reformer, etc., among which the steam reformer uses a mixture of water and fossil fuel, such as methane, liquefied petroleum gas, methanol, heavy oil or diesel, in a high-temperature catalytic reaction to generate the hydrogen-rich gas. There are other devices that can operate similar to the steam reformer, which includes the auto-thermal reformer, the partial-oxidation reformer etc. On the other hand, the plasma reformer uses plasma to pyrolyze the fossil fuel to generate the hydrogen-rich gas. In FIG. 1, the hydrogen generating device 110 further comprises: a first temperature sensor 111, that is provided for detecting the working temperature of the hydrogen generation device 110 while issuing a signal accordingly to the smoke distributing device 130 for controlling the operation of the smoke distributing device 130. As such hydrogen generating reaction is an endothermal reaction that it can only be enabled under a high temperature environment, the hydrogen generation device 110 must be heated continuously for maintaining the hydrogen generation device 110 at a specific high temperature so as to ensure and enable the hydrogen generating reaction.

There can be various devices to be used as the combustion device 120, such as boilers, melting furnaces, furnace, heat treatment furnace, forging furnace, blast furnaces, kilns, and so on, whichever can be used for burning the fuel 121. The combustion device 120 is coupled to the hydrogen generation device 110 for receiving the hydrogen-rich gas to be used for combustion and generating heat energy and flue gas.

The smoke distributing device 130 is coupled to the hydrogen generation device 110 and the combustion device 120, and is disposed at the exhaust outlet of the combustion device 120. Operationally, as soon as the flue gas from the combustion device 120 enters the smoke distributing device 130, the temperature of the flue gas is detected by the first temperature sensor 111 and thus a signal is issued for controlling the smoke distributing device 130 to guide the flue gas to flow either to the hydrogen generation device or atmosphere. To achieve the aforesaid guidance of the flue gas flow, the smoke distributing device 130 is substantially a multi-way valve that is arranged coupling to the hydrogen generation device 110, the combustion device 120 and external atmosphere for controlling the combustion device 120 to either communicate with the hydrogen generation device 110 or communicate with external atmosphere.

It is noted that the exhaust pipe of any conventional combustion device is generally a one-way pipe, and thereby the exhaust of the combustion device is discharged directly into atmosphere while the exhaust can be very hot. Accordingly, the smoke distributing device 130 of the present disclosure is disposed at the exhaust outlet of the combustion device 120 and is operating for guiding the flue gas to the hydrogen generating device 110 for heating the same, and the same time, the amount of flue gas to be sent to the hydrogen generating device 110 can be controlled by adjusting the smoke distributing device 130 according to the heating requirement of the hydrogen generating device 110. Since a multi-way valve is being used as the smoke distributing device 130, the openness of the valve is increased when the hydrogen generating device 110 is required to be heated rapidly, and moreover the openness of the exhaust pipe is reduced for forcing more flue gas to flow into the hydrogen generating device 110; on the other hand, when the hydrogen generating device 110 is overheated, the valve is closed for guiding the flue gas to be discharge into atmosphere via the exhaust pipe. Thereby, the heating to the hydrogen generating device 110 is controllable.

In FIG. 1, the hydrogen-generation fuel preheating device 140 is coupled to the smoke distributing device 130 for capturing waste heat of the flue gas from the smoke distributing device 130 to preheat a hydrogen-generation fuel 141 to be used in the hydrogen generation device 110. It is noted that the hydrogen-generation fuel 141 can be a mixture of water and fossil fuels. Similar, as the hydrogen generating reaction is an endosthermal reaction that it can only be enabled under a high temperature environment, it is beneficiary to preheat the hydrogen-generation fuel 141 by the use of the waste flue gas.

The power generating device 150 is coupled to the hydrogen-generation fuel preheating device 140 for receiving the flue gas from the hydrogen-generation fuel preheating device 140 while recycling waste heat of the flue gas to generate power to at least one of the devices selected from the group consisting of: the hydrogen generation device 110 and the combustion device 120. In an embodiment, the power generating device 150 is a device selected from the group consisting of: an Organic Rankine Cycle (ORC) device, and a Thermoelectric Power Generation (TEG) device. Nevertheless, neither the ORC device nor the TEG device can generate electrical energy without temperature differences, and thus a coolant 151 is needed as shown in FIG. 1. It is noted that the coolant can be water or air, whereas such coolant can also be preheated before entering into the combustion device 120.

The waste heat recycling device 160 is coupled to the power generating device 150 for recycling heat of the flue gas after the flue gas passes through the power generating device 150. Since the temperature of the coolant 151 may not be high enough even after passing through the power generating device 150 and/or the smoke distributing device 130, the coolant 151 can further be guided to flow through the waste heat recycling device 160 for recovering the waste heat even further, as indicated by the bold arrow line shown in FIG. 1. The waste flue gas from the waste heat recycling device 160 is discharged into atmosphere. It is noted that the waste heat recycling device 160 is not a necessity device, that is, if the temperature of the coolant 151 after passing through the power generating device 150 and/or the smoke distributing device 130 is determined to be high enough, the waste heat recycling device 160 can be removed from the system and thus the coolant 151 is guided to flow directly to the combustion device 120.

In the embodiment shown in FIG. 1, the waste flue gas from the combustion device 120 is hot enough to heat the hydrogen generating device 110 as the temperature of the waste flue gas from a common metal treatment furnace is generally higher than 600° C., and thus the waste flue gas is guided by the smoke distributing device 130 to flow toward the hydrogen generating device 110. Thereafter, after the hydrogen generating device 110 is heated to a working temperature, the first temperature sensor is enabled to issue a signal for controlling the smoke distributing device 130 to maintain only a specific amount of flue gas to flow into the hydrogen generating device 110 while allowing the rest of the flue gas to be discharged into atmosphere.

Figure 2:
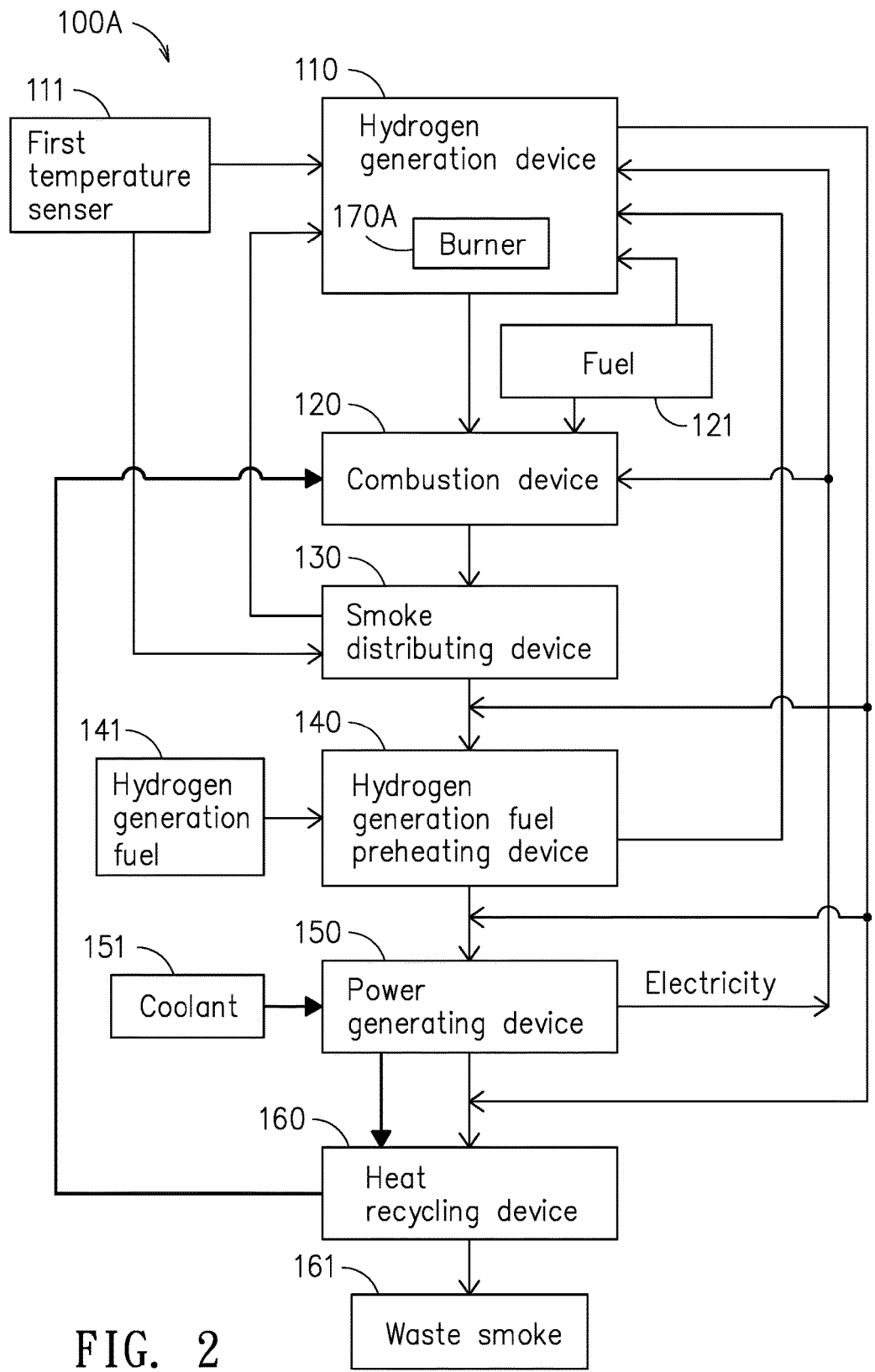
FIG. 2 is a block diagram of an integrated combustion device power saving system of FIG. 1 that is integrated with a burner.

Please refer to FIG. 2, which is a block diagram of an integrated combustion device power saving system of FIG. 1 that is integrated with a burner. In FIG. 2, the integrated combustion device power saving system 100A comprises: a hydrogen generation device 110, a combustion device 120, a smoke distributing device 130, a hydrogen-generation fuel preheating device 140, a power generating device 150, and a heat recycling device 160. Similarly, the hydrogen generation device 110 uses a first temperature sensor 111 for detecting the working temperature of the hydrogen generation device 110 while issuing a signal accordingly to the smoke distributing device 130 for controlling the operation of the smoke distributing device 130. The hydrogen-generation fuel preheating device 140 is used to preheat the hydrogen-generation fuel 141. The power generating device 150 is used to preheat the coolant 151. It is noted that the aforesaid devices are constructed and worked similar to those described in FIG. 1, but the difference between the present embodiment and the embodiment shown in FIG. 1 is that: the hydrogen generation device 110 of FIG. 2 has a burner 170A installed therein, that is to be used for providing heat energy to the hydrogen generation device 110 for raising the temperature thereof. The burner 170A can use the same fuel for the combustion device 120 or it can use the hydrogen-generation fuel 141.

Figure 3:
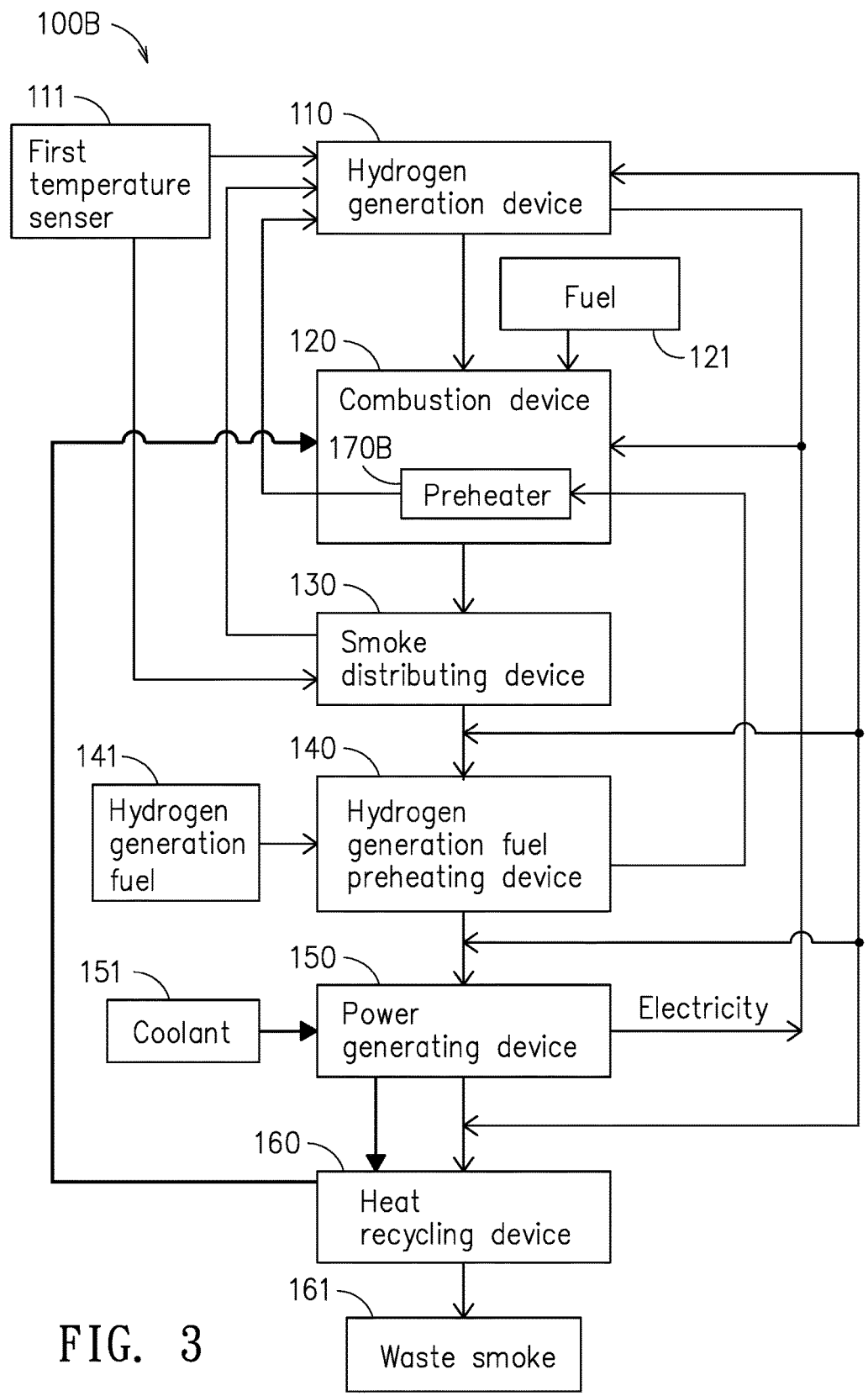
FIG. 3 is a block diagram of an integrated combustion device power saving system of FIG. 1 that is integrated with a preheater.

Please refer to FIG. 3, which is a block diagram of an integrated combustion device power saving system of FIG. 1 that is integrated with a preheater. In FIG. 3, the integrated combustion device power saving system 100A comprises: a hydrogen generation device 110, a combustion device 120, a smoke distributing device 130, a hydrogen-generation fuel preheating device 140, a power generating device 150, and a heat recycling device 160. Similarly, the hydrogen generation device 110 uses a first temperature sensor 111 for detecting the working temperature of the hydrogen generation device 110 while issuing a signal accordingly to the smoke distributing device 130 for controlling the operation of the smoke distributing device 130. The hydrogen-generation fuel preheating device 140 is used to preheat the hydrogen-generation fuel 141. The power generating device 150 is used to preheat the coolant 151. It is noted that the aforesaid devices are constructed and worked similar to those described in FIG. 1, but the difference between the present embodiment and the embodiment shown in FIG. 1 is that: the combustion device 120 of FIG. 3 has a preheater 170B installed therein, that is to be used for capturing heat from combustion device 120 for preheating and raising the temperature of the hydrogen-generation fuel 141 before it enters the hydrogen generating device 110. It is noted that the preheater of FIG. 3 and the burner of FIG. 2 can be adopt simultaneously, by that the raising of the temperature of the hydrogen generating device 110 can be enabled even more effectively.

In the embodiment shown in FIG. 1, the waste flue gas from the combustion device 120 is hot enough to heat the hydrogen generating device 110. However, there can be a variety of factors that can cause the waste flue gas fail to provide sufficient heat to the hydrogen generating device 110. Therefore, it is need either to have a burner 170A fitted inside the hydrogen generating device 110, or to have a preheater 170B fitted inside the combustion device 120, so as to raise the temperature of the hydrogen generating device 110 effectively. Therefore, the function of the burner 170A and that of the preheater 170B are the same, that are both provided and used as an additional heating device for the hydrogen generating device 110.

As shown in FIG. 3, operationally after the combustion device is activated and operating in a steady state and before the hydrogen generating device 110 is activated, the smoke distributing device 130 is enabled to guide most of the flue gas to the hydrogen generating device 110 for raising the temperature of the hydrogen generating device 110. It is noted that after the flue gas passes through the hydrogen generating device 110, it will be guided to flow back to the downstream of the smoke distributing device 130, the hydrogen-generation fuel preheating device 140 or the power generating device 150. Thereafter, as soon as the hydrogen generating device 110 reaches a specific temperature, that is about the same as the temperature of the flue gas but is still not high enough to enable a hydrogen generating reaction, the hydrogen-generation fuel 141 is driven to flow passing the preheater 170A inside the hydrogen-generation fuel preheating device 140 for raising the temperature of the hydrogen-generation fuel 141 to a temperature high than the required temperature for enabling the hydrogen generating reaction, by that the temperature of the hydrogen generating device 110 can be raised gradually by the hydrogen-generation fuel 141 after the hydrogen-generation fuel 141 enters the hydrogen generating device 110. At the same time that as the flue gas in no longer being used for heating the hydrogen generating device 110, it can be used for forming an insulation layer around the hydrogen generating device 110 while most of the flue gas at this point will be guided by the smoke distributing device 130 to flow to the downstream of the system and only allow a small portion of the flue gas to flow to the smoke distributing device 130. It is noted that the aforesaid process is controlled by the smoke distributing device 130, that is enabled according to the detection and signal of the first temperature sensor 111 that is mounted on the hydrogen generating device 110. Then, after the power generating device 150 is activated and has received the flue gas, a power generating process will be enabled. However, at the early stage of the power generating process, the power generation capacity may be small as the temperature of the power generating device 150 may not reach its working temperature, but it can be increasing gradually. It is noted that the power generating device 150 can use air or water as its coolant 151, and the power generated by the power generating device 150 can be provided to peripheral devices of the combustion device 120 and the hydrogen generating device 110, or other devices. Moreover, the coolant 151 travels passing through the power generating device 150 can be guided to the heat recycling device 160, where it is further heated before it is being guided to the combustion device 150. On the other hand, the coolant after the power generating device 150 can be guided to the combustion device 120 directly.

Figure 4:
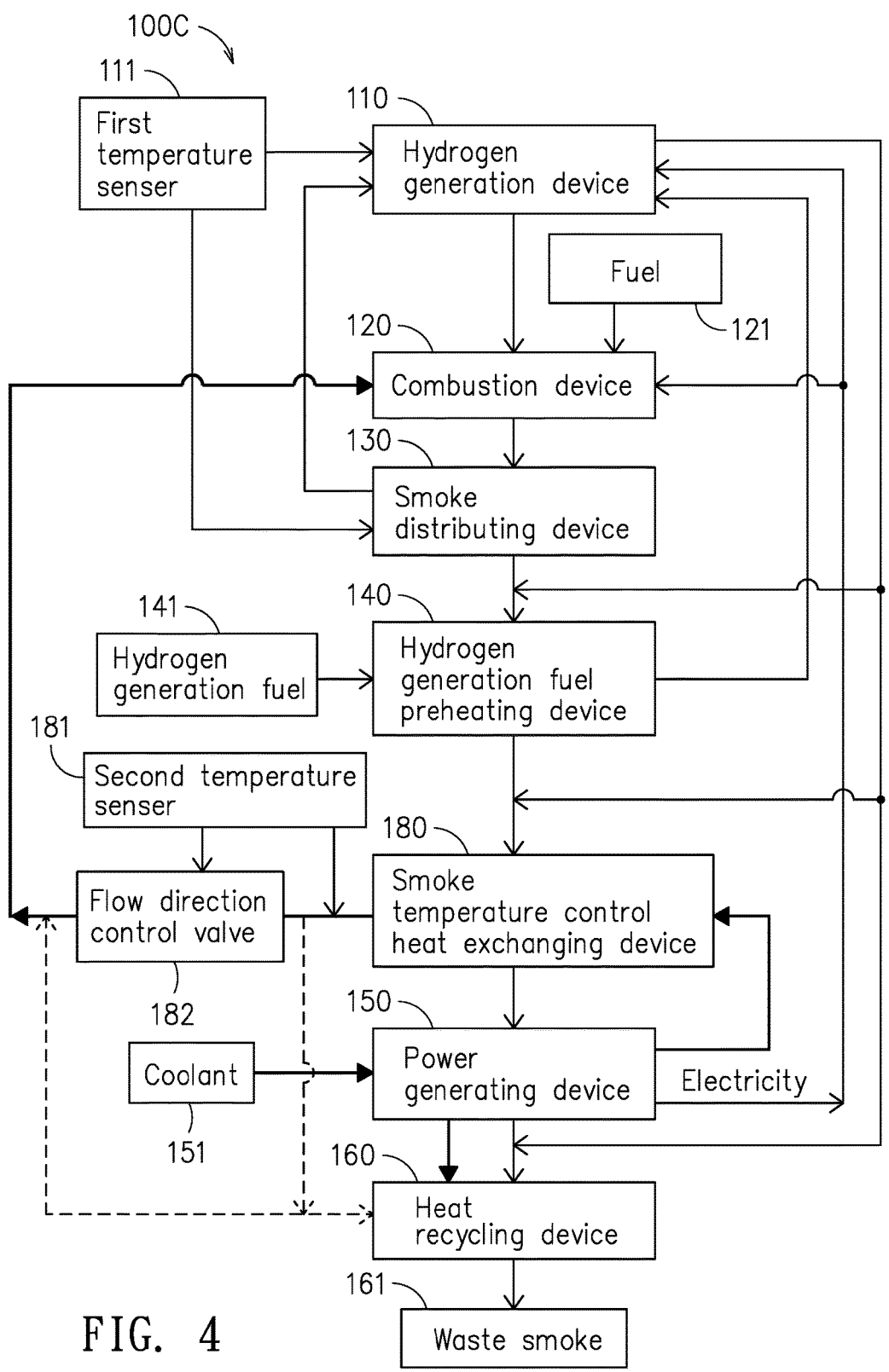
FIG. 4 is a block diagram of an integrated combustion device power saving system of FIG. 1 that is integrated with a flue gas temperature control heat exchanger.

Please refer to FIG. 4, which is a block diagram of an integrated combustion device power saving system of FIG. 1 that is integrated with a flue gas temperature control heat exchanger. In FIG. 4, the integrated combustion device power saving system 100C comprises: a hydrogen generation device 110, a combustion device 120, a smoke distributing device 130, a hydrogen-generation fuel preheating device 140, a power generating device 150, and a heat recycling device 160. Similarly, the hydrogen generation device 110 uses a first temperature sensor 111 for detecting the working temperature of the hydrogen generation device 110 while issuing a signal accordingly to the smoke distributing device 130 for controlling the operation of the smoke distributing device 130. The hydrogen-generation fuel preheating device 140 is used to preheat the hydrogen-generation fuel 141. The power generating device 150 is used to preheat the coolant 151. It is noted that the aforesaid devices are constructed and worked similar to those described in FIG. 1, but the difference between the present embodiment and the embodiment shown in FIG. 1 is that: there is a flue gas temperature control heat exchanger 180 that is being disposed at a position between the hydrogen-generation fuel preheating device 140 and the power generating device 150 so as to be used for receiving the flue gas from the hydrogen-generation fuel preheating device 140 and the coolant 151 from the power generating device 150. The coolant 151 can further be guided to flow through the flue gas temperature control heat exchanger 180 for reducing the temperature of the flue gas, as indicated by the bold arrow line shown in FIG. 4.

When the power generating device 150 is working as a thermoelectric device, its working temperature is about under 300° C., but when the power generating device 150 is an ORC device whose suitable working temperature is about 200° C. and can be damaged by overheat, thus the temperature of the flue gas must be lower before entering into the power generating device as the temperature of the flue gas from a common metal treatment furnace is generally higher than 500° C. Consequently, the temperature lowering is carried out by the flue gas temperature control heat exchanger 180. In this embodiment, the coolant for the flue gas temperature control heat exchanger 180 can be the air and water that are flowing passing the power generating device 150 for dissipating heat, whereas such coolant is already preheated by the power generating device 150. In addition, the flue gas temperature control heat exchanger 180 has a second temperature sensor 181, that is provided for detecting the temperature of the coolant 151 after the coolant 151 is flowing out of the flue gas temperature control heat exchanger 180 for determining whether the temperature of the coolant 151 is lower than the temperature of the flue gas from the power generating device 150; and if so, a detection signal is issued to the flow direction control valve 182 for enabling the flow direction control valve 182 to guide the coolant 151 to flow back to the waste heat recycling device 160.

In other embodiments of the present disclosure, there can be no power generating devices and processes included, but only the processes and devices relating to hydrogen assisted combustion is included, so that a simple fuel saving object can also be achieved.

Figure 5:
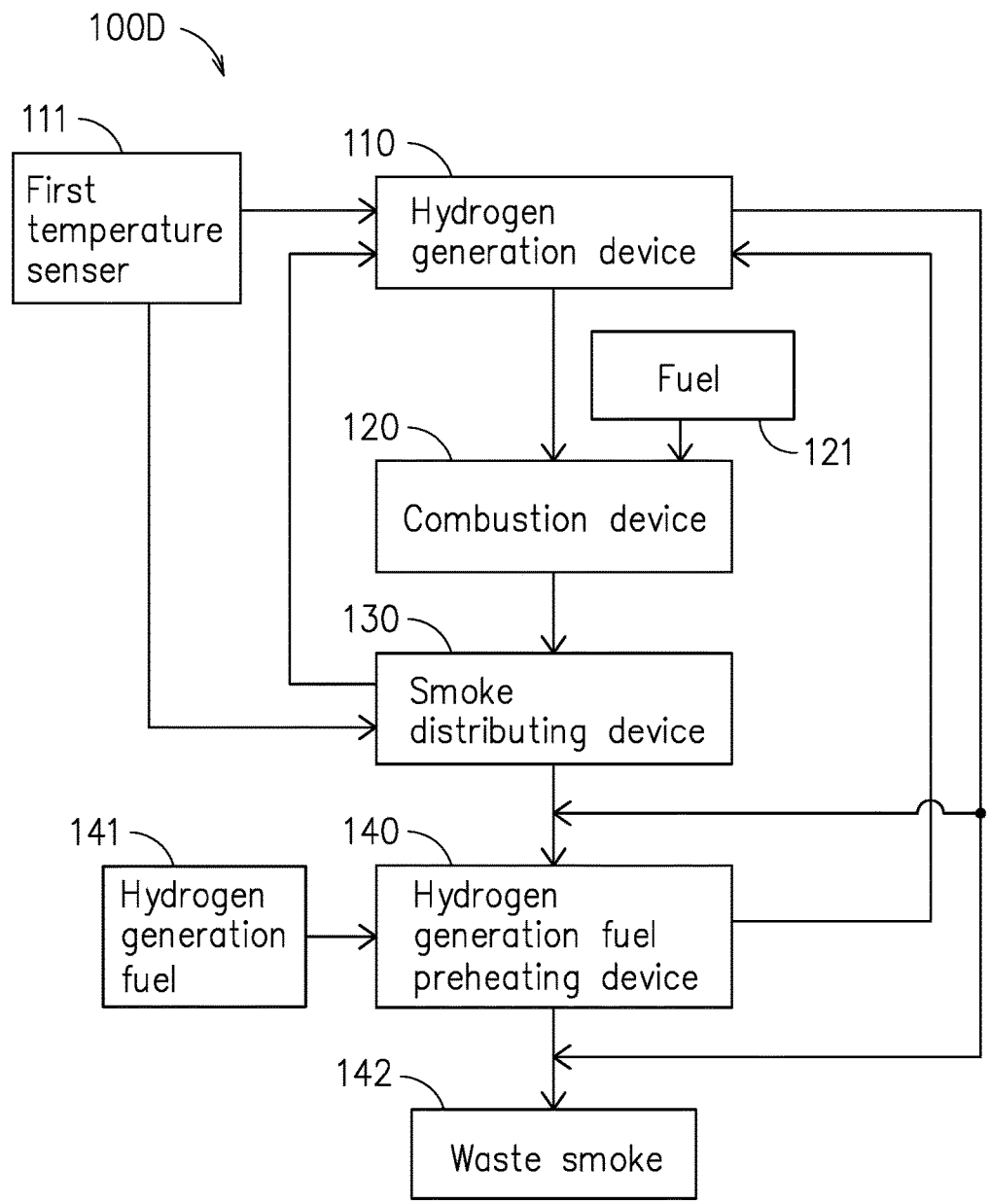
FIG. 5 is a block diagram of an integrated combustion device power saving system according to another embodiment of the present disclosure.

Please refer to FIG. 5, which is a block diagram of an integrated combustion device power saving system according to another embodiment of the present disclosure. In FIG. 5, the integrated combustion device power saving system 100D comprises: a hydrogen generation device 110, a combustion device 120, a smoke distributing device 130, and a hydrogen-generation fuel preheating device 140. Similarly, the hydrogen generation device 110 uses a first temperature sensor 111 for detecting the working temperature of the hydrogen generation device 110 while issuing a signal accordingly to the smoke distributing device 130 for controlling the operation of the smoke distributing device 130. The hydrogen-generation fuel preheating device 140 uses the waste heat of the flue gas to preheat the hydrogen-generation fuel 141, while the exhaust of the hydrogen-generation fuel preheating device 140 is discharge direct into atmosphere. It is noted that the aforesaid devices are constructed and worked similar to those described in FIG. 1, but the difference between the present embodiment and the embodiment shown in FIG. 5 is that: there is no power generating device 150 and heat recycling device 160 and related processed in this embodiment.

Figure 6:
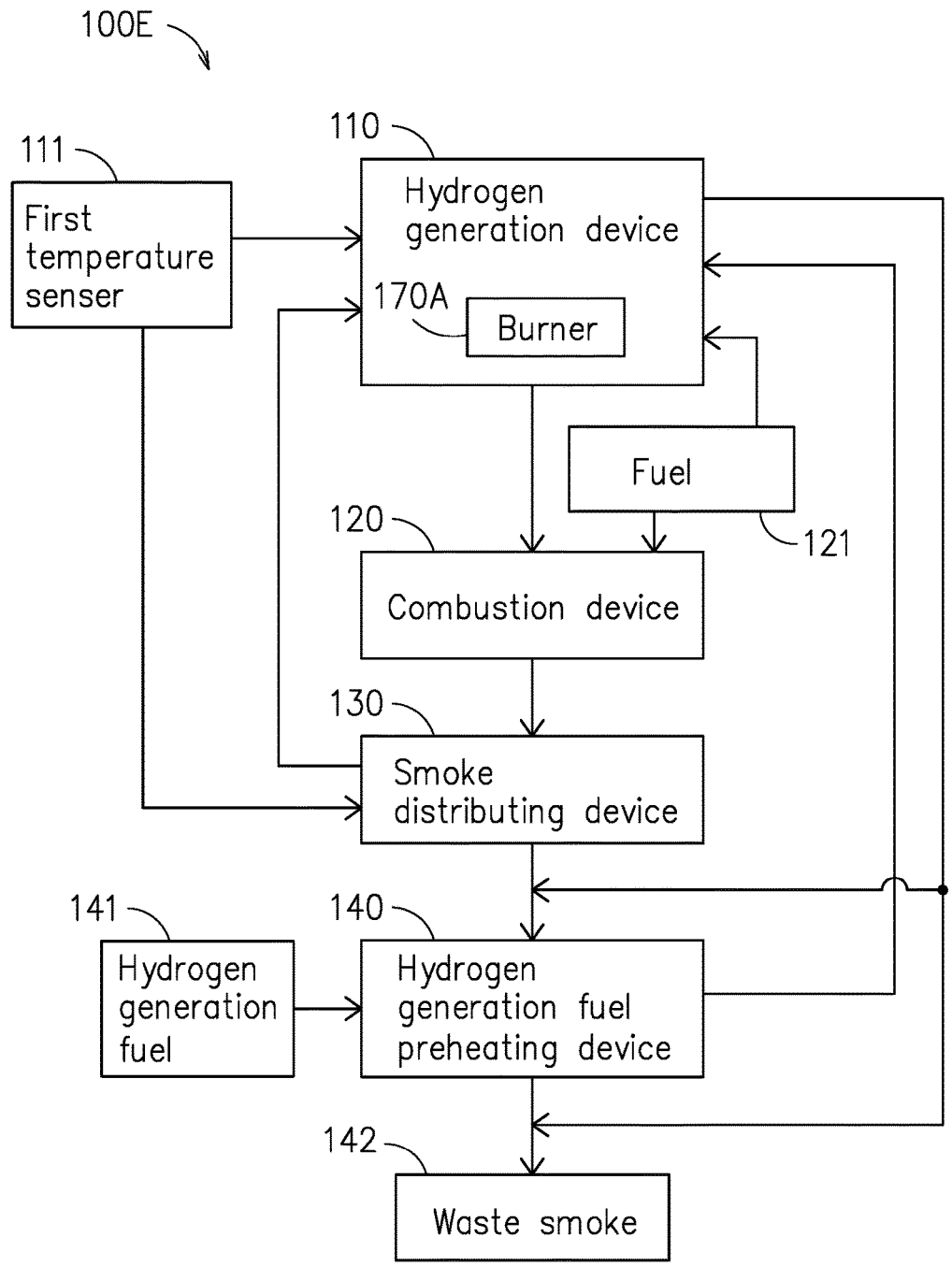
FIG. 6 is a block diagram of an integrated combustion device power saving system of FIG. 5 that is integrated with a burner.

Please refer to FIG. 6, which is a block diagram of an integrated combustion device power saving system of FIG. 5 that is integrated with a burner. In FIG. 6, the integrated combustion device power saving system 100E comprises: a hydrogen generation device 110, a combustion device 120, a smoke distributing device 130, a hydrogen-generation fuel preheating device 140, and a burner 170A. Similarly, the hydrogen generation device 110 uses a first temperature sensor 111 for detecting the working temperature of the hydrogen generation device 110 while issuing a signal accordingly to the smoke distributing device 130 for controlling the operation of the smoke distributing device 130. The hydrogen-generation fuel preheating device 140 uses the waste heat of the flue gas to preheat the hydrogen-generation fuel 141, while the exhaust of the hydrogen-generation fuel preheating device 140 is discharge direct into atmosphere. It is noted that the aforesaid devices are constructed and worked similar to those described in FIG. 2, but the difference between the present embodiment and the embodiment shown in FIG. 6 is that: there is no power generating device 150 and heat recycling device 160 and related processed in this embodiment.

Figure 7:
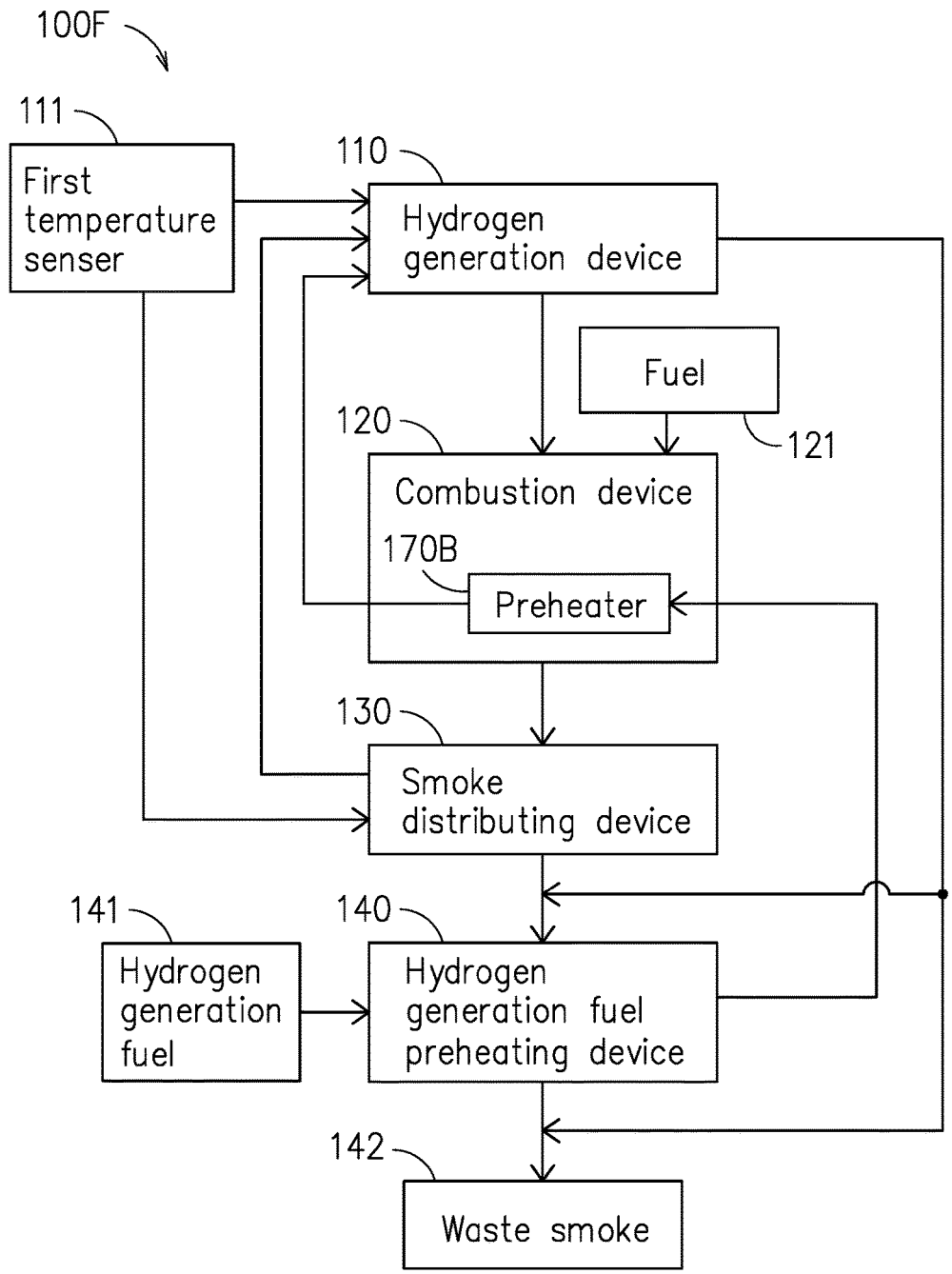
FIG. 7 is a block diagram of an integrated combustion device power saving system of FIG. 5 that is integrated with a preheater.

Please refer to FIG. 7, which is a block diagram of an integrated combustion device power saving system of FIG. 5 that is integrated with a preheater. In FIG. 7, the integrated combustion device power saving system 100E comprises: a hydrogen generation device 110, a combustion device 120, a smoke distributing device 130, a hydrogen-generation fuel preheating device 140, and a preheater 170B. Similarly, the hydrogen generation device 110 uses a first temperature sensor 111 for detecting the working temperature of the hydrogen generation device 110 while issuing a signal accordingly to the smoke distributing device 130 for controlling the operation of the smoke distributing device 130. The hydrogen-generation fuel preheating device 140 uses the waste heat of the flue gas to preheat the hydrogen-generation fuel 141, while the exhaust of the hydrogen-generation fuel preheating device 140 is discharge direct into atmosphere. It is noted that the aforesaid devices are constructed and worked similar to those described in FIG. 3, but the difference between the present embodiment and the embodiment shown in FIG. 7 is that: there is no power generating device 150 and heat recycling device 160 and related processed in this embodiment.

To sum up, the integrated combustion device power saving system of the present disclosure primarily includes an upstream hydrogen generating device and a downstream power generating device, in which the hydrogen generating device uses heat of waste flue gas from its combustion device as energy source to produce hydrogen-rich gases, whereas the hydrogen-rich gases is further being provided to combustion device to be mixed with the fuel thereof for achieving more effective and clean combustion, and moreover, the power generating device is provided for converting heat of the waste flue gas into electricity to be used by peripheral devices of the combustion device and the hydrogen generating device, or other devices. Overall, the object of power and fuel saving can be achieved, and even when the hydrogen generating device in the present disclosure is used and operated along without the power generating device for producing hydrogen-rich gases to assist combustion, the fuel saving object can also be achieved. In addition, the hydrogen generating device can operate and function not only to save fuel by enabling better combustion efficiency, but also it can reduce the pollution cause by waste flue gas since the flue gas is treated by its heat recycling device that it is cleaner and cooler. On the other hand, by the operation of the power generating device, the reliance of the combustion device on the popular power grid is reduced, not to mention that it can use heat from the waste flue gas to generate electricity for not only its peripheral devices, but also other electric devices.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. An integrated combustion device power saving system, comprising:
    a hydrogen generation device for generating a hydrogen-rich gas;
    a combustion device, located downstream of and coupled to the hydrogen generation device for receiving the hydrogen-rich gas to be used for combustion and generating heat energy and flue gas;
    a smoke distributing device, coupled to the hydrogen generation device and the combustion device and capable of distributing flue gas to the hydrogen generation device or atmosphere;
    a hydrogen-generation fuel preheating device, coupled to the smoke distributing device and capable of capturing waste heat of the flue gas from the smoke distributing device to preheat a hydrogen-generation fuel to be used in the hydrogen generation device;
    a power generating device, coupled to the hydrogen-generation fuel preheating device and capable of receiving the flue gas from the hydrogen-generation fuel preheating device while recycling waste heat of the flue gas to generate power to at least one of the devices selected from the group consisting of: the hydrogen generation device and the combustion device;
    a waste heat recycling device, located downstream of and coupled to the power generating device for recycling heat of the flue gas after the flue gas passes through the power generating device; and
    a flue gas temperature control heat exchanger, located downstream of the hydrogen-generation fuel preheating device on the flue gas side and downstream of the power generating device on the coolant side so as to be used for receiving the flue gas from the hydrogen-generation fuel preheating device and the coolant from the power generating device for using the coolant to lower the temperature of the flue gas,
    wherein the hydrogen generation device comprises a first temperature sensor for detecting a working temperature of the hydrogen generation device while transmitting a signal to the smoke distributing device for controlling the flow direction of the flue gas from the smoke distributing device.

2. The integrated combustion device power saving system of claim 1, further comprising:
    a flow direction control valve, located downstream of the gas temperature control heat exchanger on the coolant side, for controlling the flow direction of the coolant after the coolant is flowing out of the flue gas temperature control heat exchanger.

3. The integrated combustion device power saving system of claim 2, further comprising:
    a second temperature sensor, located downstream of the flue gas temperature control heat exchanger, for detecting the temperature of the coolant after the coolant is flowing out of the flue gas temperature control heat exchanger for determining whether the temperature of the coolant is lower than the temperature of the flue gas from the power generating device; and if so, a detection signal is issued to the flow direction control valve for enabling the flow direction control valve to guide the coolant to flow back to the waste heat recycling device.

4. The integrated combustion device power saving system of claim 1, wherein the power generating device is a device selected from the group consisting of: an Organic Rankine Cycle (ORC) device, and a Thermoelectric Power Generation (TEG) device.

5. The integrated combustion device power saving system of claim 1, further comprising:
    a burner, acting as an addition heating device and being disposed inside the hydrogen generation device for increasing the temperature of the hydrogen generation device.

6. The integrated combustion device power saving system of claim 5, wherein the burner is designed to use a fuel selected from the group consisting of: a fuel for the combustion device and the hydrogen-generation fuel.

7. The integrated combustion device power saving system of claim 1, further comprising:
    a preheater, acting as an addition heating device and being disposed inside the combustion device for capturing heat from the combustion device to increase the temperature of the hydrogen generation device.

8. The integrated combustion device power saving system of claim 1, wherein the smoke distributing device is a multi-way valve that is arranged coupled to the hydrogen generation device, the combustion device and external atmosphere for controlling the combustion device to either communicate with the hydrogen generation device or communicate with external atmosphere.

9. The integrated combustion device power saving system of claim 1, wherein the hydrogen generation device is a device selected from the group consisting of: a steam reformer, an auto-thermal reformer, a partial oxidation reformer, and a plasma reformer.

* * * * *